United States Patent
Iitsuka et al.

(10) Patent No.: US 9,929,286 B2
(45) Date of Patent: Mar. 27, 2018

(54) SOLAR CELL MODULE WITH ANTI-GLARE FILM AND METHOD FOR MANUFACTURING SAME, ANTI-GLARE FILM FOR SOLAR CELL MODULES AND METHOD FOR MANUFACTURING SAME, AND COATING SOLUTION FOR FORMING ANTI-GLARE FILM

(71) Applicant: KANEKA CORPORATION, Osaka-shi, Osaka (JP)

(72) Inventors: Naoto Iitsuka, Osaka (JP); Kazuhiro Shimizu, Osaka (JP); Takeyoshi Takahashi, Osaka (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 105 days.

(21) Appl. No.: 14/430,525

(22) PCT Filed: Sep. 20, 2013

(86) PCT No.: PCT/JP2013/075595
§ 371 (c)(1),
(2) Date: Mar. 23, 2015

(87) PCT Pub. No.: WO2014/050769
PCT Pub. Date: Apr. 3, 2014

(65) Prior Publication Data
US 2015/0249166 A1    Sep. 3, 2015

(30) Foreign Application Priority Data

Sep. 25, 2012    (JP) ................. 2012-211510

(51) Int. Cl.
*H01L 31/0216*    (2014.01)
*G02B 5/02*    (2006.01)
(Continued)

(52) U.S. Cl.
CPC .......... *H01L 31/02168* (2013.01); *G02B 1/10* (2013.01); *G02B 5/0215* (2013.01);
(Continued)

(58) Field of Classification Search
CPC . H01L 31/02168; H01L 31/18; G02B 5/0215; G02B 1/10
(Continued)

(56) References Cited

U.S. PATENT DOCUMENTS 4,532,537 A    7/1985    Kane
6,384,318 B1 *    5/2002    Nomura .............. H01L 31/0236
                                                        136/246
(Continued)

FOREIGN PATENT DOCUMENTS

EP    0991129 A1    4/2000
FR    2533755 A1    3/1984
(Continued)

OTHER PUBLICATIONS

Du et al., Graded porous glasses for atireflective applications formed by chemical treatment, Applied Surface Science, vol./Issue 258 pp. 6431-6435, Mar. 2012.*
(Continued)

*Primary Examiner* — Jayne L Mershon
(74) *Attorney, Agent, or Firm* — Alleman Hall Creasman & Tuttle LLP

(57) ABSTRACT

The solar cell module includes an anti-glare film on a transparent insulating substrate. The anti-glare film is a continuous film that contains transparent inorganic fine particles in an inorganic binder, and is free of cracks. The anti-glare film preferably has an average thickness $d_1$ of 500 nm to 2000 nm, and a maximum surface height $Ry_1$ of 1000 nm to 10000 nm. The inorganic binder is preferably composed mainly of silicon oxide containing Si—O bonds (Continued)

obtained by the hydrolysis of Si—H bonds and Si—N bonds. The inorganic fine particles are non-spherical particles having ground surfaces, and preferably have an average primary particle size, calculated from cross-sectional observations of the anti-glare film, of 0.1 µm to 5.0 µm.

14 Claims, 11 Drawing Sheets

(51) Int. Cl.
　　G02B 1/10　　(2015.01)
　　H01L 31/18　　(2006.01)
　　H01L 31/048　　(2014.01)
(52) U.S. Cl.
　　CPC ......... G02B 5/0242 (2013.01); G02B 5/0294 (2013.01); H01L 31/048 (2013.01); H01L 31/18 (2013.01); G02B 2207/109 (2013.01); Y02B 10/12 (2013.01); Y02E 10/50 (2013.01)
(58) Field of Classification Search
　　USPC ........................................................ 136/256
　　See application file for complete search history.

(56) References Cited

U.S. PATENT DOCUMENTS

| | | | |
|---|---|---|---|
| 2002/0129850 A1 | 9/2002 | Nomura | |
| 2006/0269724 A1* | 11/2006 | Ohashi | G02B 1/111 428/143 |
| 2011/0073162 A1 | 3/2011 | Kikuchi et al. | |
| 2011/0075261 A1* | 3/2011 | Fukuda | C08J 7/047 359/580 |
| 2012/0024345 A1* | 2/2012 | Reisfeld | H01L 31/055 136/247 |
| 2013/0038939 A1* | 2/2013 | Walker, Jr. | G02B 5/0242 359/601 |
| 2013/0337274 A1 | 12/2013 | Ozaki | |

FOREIGN PATENT DOCUMENTS

| | | |
|---|---|---|
| JP | H1123803 A | 1/1999 |
| JP | H11330508 A | 11/1999 |
| JP | 2001-053316 * | 2/2001 |
| JP | 200153316 A | 2/2001 |
| JP | 2002134178 A | 5/2002 |
| JP | 2004004176 A | 1/2004 |
| JP | 2004209973 A | 7/2004 |
| JP | 2005099756 A | 4/2005 |
| JP | 2006222192 A | 8/2006 |
| JP | 2012009600 A | 1/2012 |
| JP | 2013197556 A | 9/2013 |
| WO | 2004113966 A1 | 12/2004 |
| WO | 2008062605 A1 | 5/2008 |
| WO | 2009142156 A1 | 11/2009 |
| WO | 2012117990 A1 | 9/2012 |

OTHER PUBLICATIONS

Thompson et al., Nanostructured PVP/SiO2 Antireflective Coating for Solar Panel Applications, IEEE International Conference on Nanotechnology, pp. 768-771 (2013).*
European Patent Office, Partial Supplementary European Search Report Issued in Application No. 13840857.0, dated Apr. 8, 2016, 6 pages.
International Bureau of WIPO, International Preliminary Report on Patentability Issued in Application No. PCT/JP2013/075595, dated Apr. 9, 2015, WIPO, 9 pages.
ISA Japanese Patent Office, International Search Report Issued in Application No. PCT/JP2013/075595, dated Jan. 7, 2014, WIPO, 4 pages.

* cited by examiner

SOLAR CELL MODULE WITH ANTI-GLARE FILM AND METHOD FOR MANUFACTURING SAME, ANTI-GLARE FILM FOR SOLAR CELL MODULES AND METHOD FOR MANUFACTURING SAME, AND COATING SOLUTION FOR FORMING ANTI-GLARE FILM

TECHNICAL FIELD

The invention relates to a solar cell module with anti-glare film and a method for manufacturing thereof. In addition, the invention relates to an anti-glare film for a solar cell module and a method for manufacturing thereof, and a coating solution used for forming an anti-glare film.

BACKGROUND ART

The use of clean energy has been increasingly encouraged, and the use of solar cells has been accordingly promoted. A solar cell is generally put into practical use as a solar cell module in which an electromotive element (solar cell) composed of a single-crystalline silicon, silicon-based thin film, a compound semiconductor or the like is sealed with a resin between a surface cover glass and a back cover film. As a structure intended to reduce the cost of the solar cell module, there has been proposed a substrate-integrated thin film-based solar cell module obtained by sequentially forming a transparent electrode layer, a semiconductor layer and a second electrode layer on a transparent insulating substrate, such as glass from the light incident side while patterning the layers using a laser-scribing method.

In recent years, it has been becoming a common practice to mount a solar cell module on the roof of a house or the outer wall of a building in an urban area, and use power generation energy therefrom in the houses or offices. However, it has been pointed out that, when a solar cell module having glass on a surface on the light incident side is installed on the roof or the outer wall, a problem of light pollution may arise in that reflected light from the solar cell module illuminates the interior of the adjacent house depending on an angle of incidence of sunlight, for example.

Thus, an attempt has been made to suppress the glare by forming an irregular shape on the light incident surface of a glass substrate of a solar cell module to irregularly reflect light, and thereby preventing sunlight from being reflected in the same direction. However, for forming an irregular shape on a glass substrate itself, processing at a high temperature or the use of a solution having high reactivity, such as hydrofluoric acid, is necessary, and therefore it is difficult to form irregularities after the modularization of a solar cell. When the glass substrate itself is processed before the modularization, there is the problem in that it is difficult to pattern an electrode layer and a semiconductor layer by laser-scribing because laser light is scattered by the glass substrate.

On the other hand, it has been proposed that, after a solar cell is modularized, an irregularly-shaped film (hereinafter, referred to as an anti-glare film) containing inorganic fine particles in a binder is formed on a glass surface (for example, see Patent Document 1 and Patent Document 2). It has also been proposed that an anti-reflection layer containing spherical inorganic particles having a particle size of 50 to 200 nm in a binder is formed on a glass surface to increase the amount of light captured in a solar cell (for example, see Patent Document 3). These prior art documents propose that a partially hydrolyzed condensate of an alkyl silicate such as tetraethylorthosilicic acid (TEOS) is used as a binder, and spherical silica or the like is used as fine particles.

In addition, a film containing fine particles in an acryl-based or urethane-based organic polymer matrix is formed as an anti-glare film on the surface of a display (for example, see Patent Document 4).

PRIOR ART DOCUMENTS

Patent Documents

Patent Document 1: JP-A-2001-53316
Patent Document 2: JP-A-11-330508
Patent Document 3: WO 2009/142156
Patent Document 4: JP-A-2004-4176

SUMMARY OF THE INVENTION

Problems to be Solved by the Invention

A solar cell module is generally installed on a roof or an outer wall on the sunlight-irradiated surface (the south side in the northern hemisphere), and reflected light from the solar cell module is reflected mainly to the upper side of the installation place of the module, i.e. above the roof of the adjacent house. It has been proposed that an anti-glare film or an anti-reflection layer is provided on a surface of a glass substrate as described above, but light pollution has been rarely widely discussed heretofore, and a solar cell module with an anti-glare film or an anti-reflection layer provided on a surface of a glass substrate has not been put into practical use yet.

In recent years, however, solar cell modules have been increasingly installed on a surface other than the sunlight-irradiated surface (e.g. the north side) for the purpose of increasing power, or producing a unified sense of one roof when a roof tile-integrated solar cell module is used. Thus, it is the urgent need to impart an anti-glare property to the solar cell module. From such a viewpoint, the inventors have conducted studies to find that an anti-reflection film as disclosed in Patent Document 3 is designed mainly for the purpose of reducing the reflection amount of normal incident light, and therefore cannot exhibit the effect of suppressing light pollution by reducing the reflection amount of oblique incident sunlight.

The solar cell module is placed in the outdoors for a long period of time, and exposed to a high-temperature environment and wind and rain, and therefore the anti-glare film is required to have high adhesion to the substrate in addition to high physical durability (hardness). The inventors have evaluated the anti-glare films and anti-reflection films proposed in Patent Documents 1 to 4, and resultantly found that these films do not have sufficient film strength and adhesion to the substrate. Further, in the prior arts described above, heating at 100° C. or higher is required at the time of curing a binder to form an anti-glare film, so that a solar cell provided on a substrate may be thermally degraded.

In view of the above-mentioned problems, an object of the present invention is to provide a solar cell module in which an anti-glare film having excellent adhesion and strength and a high anti-glare effect is formed on a surface of a substrate, and provide a method for manufacturing the solar cell module.

Means for Solving the Problems

As a result of conducting vigorous studies in view of the above-mentioned problems, the inventors have found that the above-mentioned problems can be solved by the following constitutions. That is, the present invention relates to a solar cell module including at least one solar cell on a first principal surface of a transparent insulating substrate and an anti-glare film on a second principal surface of the transparent insulating substrate.

In the solar cell module of the present invention, the anti-glare film is a continuous film having no cracks. The anti-glare film preferably has an average thickness $d_1$ of 500 to 2000 nm and a surface maximum height $Ry_1$ of 1000 to 10000 nm. The anti-glare film preferably has a surface arithmetic average roughness Ra of 250 to 2000 nm and a roughness period $Sm_1$ of 1 to 30 μm. A ratio $Ry_1/d_1$ of the thickness $d_1$ and the maximum height $Ry_1$ of the anti-glare film is preferably 1 to 20.

The inorganic binder preferably includes as a main component a silicon oxide containing an Si—O bond obtained by hydrolysis of an Si—H bond and an Si—N bond. The inorganic fine particles are nonspherical particles having a surface composed of a pulverized surface, and preferably have an average primary particle size of 0.1 to 5.0 μm as calculated from observing a cross section of the anti-glare film. Inorganic fine particles including $SiO_2$ as a main component are preferably used.

The solar cell module of the present invention may further include a second inorganic layer on a surface of the anti-glare film on a side opposite to the transparent insulating substrate. The second inorganic layer has an average thickness $d_2$ of, for example, 50 to 1000 nm, and has a refractive index smaller than that of the anti-glare film. According to this constitution, the second inorganic layer acts as an anti-reflection layer, so that the reflection loss is reduced, and therefore conversion characteristics (particularly short circuit current density) can be improved.

In one embodiment of the solar cell module of the present invention, the solar cell includes a first electrode layer, a photoelectric conversion unit and a second electrode layer from the transparent insulating substrate side, the layers are each provided with linear separation grooves and thereby divided into a plurality of cells, and the plurality of cells are electrically connected to one another in series or in parallel. The separation groove is formed by, for example, applying laser light from the second principal surface side of the transparent substrate.

In one embodiment of the solar cell module of the present invention, the solar cell may be a crystalline silicon-based solar cell including a crystalline silicon substrate.

The solar cell module of the present invention may be prepared as a color solar cell module by further including a pigment or a dye in the anti-glare film. When the anti-glare film is formed after covering a part of a surface of the transparent insulating substrate by a mask material, an anti-glare pattern module can be obtained in which an anti-glare region, on which an anti-glare film is formed, and a non-anti-glare region, on which an anti-glare film is not formed, are provided.

Further, the present invention relates to a method for manufacturing the solar cell module and a method for forming an anti-glare film for the solar cell module. In one embodiment of the manufacturing method for the solar cell module of the present invention, after a cell forming step of forming a solar cell on the first principal surface of the transparent insulating substrate, an anti-glare film forming step of forming an anti-glare film on the second principal surface of the transparent insulating substrate is carried out.

In one embodiment, an anti-glare film formation coating solution is applied onto the second principal surface of the transparent insulating substrate, and then the solvent in the anti-glare film formation coating solution is dried and the polysilazane is cured to form the anti-glare film. The anti-glare film formation coating solution preferably contains 0.01 to 20% by weight of inorganic fine particles, 0.1 to 20% by weight of a polysilazane and a solvent. This coating solution can be prepared by adding inorganic fine particles having an average secondary particle size of 0.1 to 10 μm are added in a liquid.

In one embodiment of the present invention, the cell forming step is carried out indoors, for example in a clean room, the substrate provided with a cell is then taken out to the outdoors, and the anti-glare film forming step is carried out outdoors. In this case, it is preferred to form an anti-glare film by applying the coating solution onto the transparent insulating substrate by a spraying method.

Further, the present invention relates to a coating solution which is used for the formation of the anti-glare film.

Effects of the Invention

According to the present invention, a solar cell module including an anti-glare film having a high anti-glare property and excellent physical durability (hardness) and adhesion to a substrate is obtained. Further, the solar cell module of the present invention can contribute to the reduction of light pollution. When a polysilazane is used as a binder material of the anti-glare film, an anti-glare film can be formed on a surface of a substrate of a solar cell without performing heating at high temperatures, and therefore the anti-glare film can be formed while the power generation characteristics of the solar cell are maintained.

MODE FOR CARRYING OUT THE INVENTION

Figure 1:
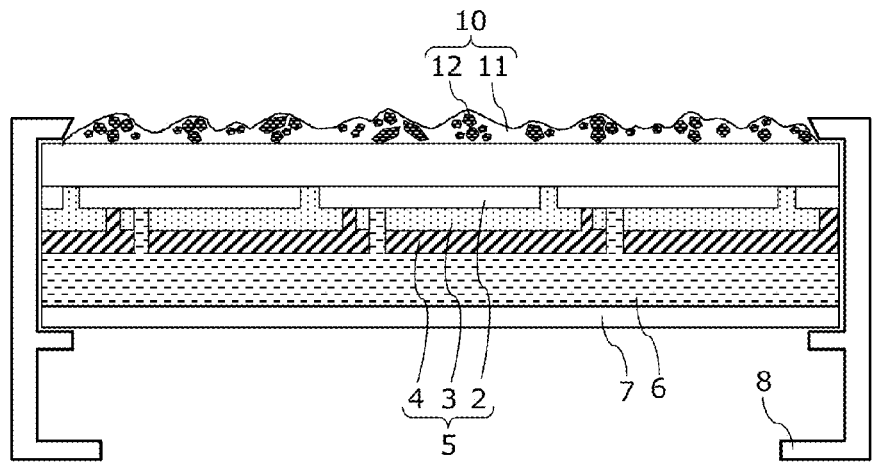
FIG. 1 is a schematic cross sectional view of a solar cell module according to one embodiment.

Referring to the drawings, preferred embodiments of a solar cell module according to the present invention will be described below. In the drawings, dimensional relationships, such as thickness and length, are properly altered as needed for clarity and simplicity of the drawings, and do not correspond to actual dimensions.

FIG. 1 is a schematic cross-sectional view showing an outline configuration of a solar cell module according to one embodiment of the present invention. This solar cell module 100 includes a transparent insulating substrate 1 and a solar cell 5 formed on a first principal surface of the transparent insulating substrate 1, and further includes an anti-glare film 10 on a second principal surface of the transparent insulating substrate.

In the embodiment shown in FIG. 1, the solar cell 5 includes a first electrode layer 2, a photoelectric conversion unit 3 and a second electrode layer 4 from the transparent insulating substrate 1 side. In FIG. 1, the solar cell 5 is divided into a plurality of regions, and the regions are mutually electrically connected in series. In the solar cell module, a filling resin 6 and a back sealing plate 7 are provided on the second electrode layer 4 for protecting the solar cell 5. Further, the solar cell sealed in this way is provided with a frame 8 that is used for holding the transparent insulating substrate 1, the filling resin 6, the back sealing plate 7 and so on, and mounting the solar cell on a pedestal such as a roof. Hereinafter, mainly an embodiment related to the thin film-based solar cell module shown in FIG. 1 will be described, but the present invention is applicable to various kinds of solar cell modules, such as crystalline silicon-based solar cell modules including a crystalline silicon substrate.

As the transparent insulating substrate 1, a glass plate, a plate-shaped member or sheet-shaped member composed of a transparent resin, or the like is used. Particularly, the glass plate is preferred because it has a high transmittance and is inexpensive. The solar cell 5 formed on a principal surface of the transparent insulating substrate 1 on a side opposite to a surface, on which the anti-glare film 10 is formed, is not particularly limited, and examples thereof include crystalline silicon-based solar cells including a single-crystalline silicon substrate or a polycrystalline silicon substrate, silicon-based thin film solar cells including an amorphous silicon thin film, a crystalline silicon thin film or the like, compound solar cells such as CIGSs and CISs, organic thin film solar cells and dye sensitized solar cells.

For example, in the silicon-based thin film solar cell, the first electrode layer 2, the photoelectric conversion unit 3 and the second electrode layer 4 are formed in this order on the transparent insulating substrate 1. As a material of the first electrode layer 2, a transparent conductive metal oxide such as ITO, $SnO_2$ or ZnO is suitably used.

As the photoelectric conversion unit 3, a semiconductor junction obtained by combining a silicon-based semiconductor thin film of amorphous silicon, amorphous silicon carbide, amorphous silicon germanium, crystalline silicon and the like in a pin type, an nip type, an ni type, a pn type or the like is used. The photoelectric conversion unit 3 may be a tandem type photoelectric conversion unit having a plurality of pn junctions, pin junctions or the like.

As the second electrode layer 4, a reflecting metal layer of Ag, At or the like, a composite layer of a metal layer and a conductive metal oxide layer, or the like is used.

Generally, the solar cell module includes a plurality of solar cells, the solar cells being electrically connected to one another in series or in parallel. Particularly, in the thin film solar cell, it is preferred that the first electrode layer 2, the photoelectric conversion unit 3 and the second electrode layer 4 are each provided with linear separation grooves, so that the layers are each divided into a plurality of regions to form a plurality of cells, and the cells are electrically connected to one another. For example, FIG. 1 illustrates an embodiment in which three photoelectric conversion cells are connected to one another in series.

Thus, an integrated solar cell with each layer divided into a plurality of cells by separation grooves can be formed by repeating the formation of each layer and the formation of separation grooves by patterning means such as laser-scribing. For example, the integrated solar cell 5 shown in FIG. 1 is manufactured by the following steps.

Separation grooves are formed in the first electrode layer 2 by laser-scribing to divide the first electrode layer 2 in a predetermined pattern, and the photoelectric conversion unit 3 is then formed on the first electrode layer 2. Thereafter, by laser-scribing that causes laser light to enter from the transparent insulating substrate 1 side, separation grooves are formed in the photoelectric conversion unit 3 to divide the photoelectric conversion unit 3 in a predetermined pattern. Thereafter, the second electrode layer is formed on the photoelectric conversion unit 3, and by a laser-scribing that causes laser light to enter from the transparent insulating substrate 1 side, the second electrode layer 4 is blown off together with the photoelectric conversion unit 3 to form separation grooves.

For efficiently forming separation grooves by laser-scribing to integrate the solar cell 5, it is preferred to cause laser light to enter from the transparent insulating substrate 1 side. Here, when the anti-glare film 10 is formed on a surface of the transparent insulating substrate 1 by laser-scribing, failures may occur in the formation of separation grooves, for example, due to the irregular reflection of laser light. Therefore, it is preferred to form an anti-glare film on the transparent insulating substrate 1 after laser-scribing.

It is preferred to provide the filling resin 6 and the back sealing plate 7 on the second electrode layer 4 for protecting the solar cell 5. As the filling resin 6, silicon, ethylene vinyl acetate, polyvinyl butyral or the like is used, and as the back sealing plate, a fluorine-based resin film, a polyethylene terephthalate film, a metal film of aluminum, for example, a laminate of these films, a film of a multilayer structure, which is formed by stacking a thin film of $SiO_2$ to these films, or the like is used.

In a crystalline silicon-based solar cell including a single-crystalline silicon substrate or a polycrystalline silicon substrate, a conductive semiconductor layer, an electrode and so on are formed on a silicon substrate to form a cell. A plurality of cells are disposed on a transparent insulating substrate with a sealing agent such as a filling resin interposed therebetween, and the cells are electrically connected to one another through an inter-connector such as a TAB to perform modularization.

The anti-glare film 10 is provided on the light incident surface side of the transparent insulating substrate 1. As described above, it is preferred to form the anti-glare film after the solar cell 5 is formed and integrated by laser-scribing. The anti-glare film can be formed at any time after laser-scribing, i.e. the anti-glare film may be formed immediately after scribing, after performing sealing with the filling resin 6 and the back sealing plate 7, or after installation of the module on a roof, an outer wall or the like. After operations up to and including the formation and sealing of a cell are performed indoors, e.g. in a factory, a solar cell module before an anti-glare film is formed on a surface of a substrate can be moved to the outdoors (e.g. the site of a house where the module is installed), followed by forming an anti-glare film before the solar cell module is installed on a roof or the like. According to the above-mentioned method, light pollution can also be prevented by selectively forming an anti-glare film only in a solar cell module installed, for example, in an azimuth opposite to the sunlight-irradiated surface (e.g. the north side in the northern hemisphere).

In the solar cell module of the present invention, a surface on which the anti-glare film 10 is formed is a sunlight incident surface, and the anti-glare film 10 has surface irregularities. When the anti-glare film 10 having surface irregularities is provided on the light incident surface side of the transparent insulating substrate 1, sunlight reflected at a surface of the solar cell module is irregularly reflected in indefinite directions. Irregularly reflected scattered light is not a parallel ray, and reflected light from the solar cell module is blurred as a whole, so that light pollution is suppressed.

[Anti-Glare Film]

The anti-glare film 10 contains an inorganic binder 11 and inorganic fine particles 12.

As inorganic fine particles 12, nonspherical particles having a surface composed of a pulverized surface are used. Nonspherical fine particles having the surface composed of the pulverized surface easily reflect light irregularly, because the sizes and shapes of the particles are non-uniform. The inorganic binder 11 plays a role to improve adhesion strength between the fine particles and between the fine particles and the transparent insulating substrate.

<Inorganic Fine Particles in Anti-Glare Film>

The material of the inorganic fine particle 12 is preferably silicon oxide ($SiO_2$), titanium oxide ($TiO_2$), aluminum oxide ($Al_2O_3$), zirconium oxide ($ZrO_2$), indium tin oxide (ITO), magnesium fluoride ($MgF_2$) or the like. Particularly, a material having a small refractive index difference with respect to the binder 11 is preferred, and one having silicon oxide as a main component is most suitably used. As an inorganic fine particle having a pulverized surface, for example, a glass frit (powdered glass) is suitably used.

The primary average particle size of inorganic fine particles 12 is preferably 0.1 to 5.0 μm, more preferably 0.5 to 4.0 μm, and further preferably 1.0 to 3.0 μm. When the particle size of nonspherical inorganic fine particles with the surface composed of pulverized surface falls within the above-mentioned range, surface irregularities suitable for irregular reflection of visible light are formed on a surface of the anti-glare film 10. Thus, the anti-glare property is improved, so that light pollution can be inhibited. The primary average particle size of the fine particles is obtained by determining the particle sizes of the particles from an observed image of a cross section of the anti-glare film and calculating an average value thereof. The particle size of each particle is defined by a diameter of a circle having an area equivalent to the projected area of the particle (projected area-circle equivalent diameter, Heywood diameter).

It has been previously proposed that an anti-reflection film having a curved irregular surface is formed on the light incident surface side of a substrate using spherical fine particles composed of acryl, silica or the like. Since the surface of the above-mentioned anti-reflection film is a spherical curved surface, an optical loss due to irregular reflection is reduced, and in addition, fine particles are easily arranged regularly, so that the anti-reflection effect tends to be enhanced. When the above-mentioned anti-reflection layer is provided on a surface of the substrate, the amount of reflected light is reduced, but the effect of irregularly reflecting light in indefinite directions is hardly obtained, and therefore it is difficult to sufficiently suppress light pollution.

On the other hand, in the present invention, the anti-glare film 10 contains fine particles 12 with a surface composed of the pulverized surface, and therefore irregularities formed on a surface of the anti-glare film have random sizes and shapes, so that light is easily reflected irregularly. Thus, reflected light from the anti-glare film 10 on a surface of the solar cell module is blurred as a whole, so that the application of reflected light in a definite direction is reduced, leading to the suppression of light pollution.

<Binder in Anti-Glare Film>

As the inorganic binder 11 in the anti-glare film 10 in the present invention, a silicon oxide is suitably used, and particularly a silicon oxide containing an Si—O bond obtained by the hydrolysis of an Si—H bond and an Si—N bond is suitably used. When the silicon oxide contains an Si—O bond obtained by the hydrolysis of an Si—H bond and an Si—N bond, the binder has high transparency, and in addition, the anti-glare film is excellent in its adhesion with a transparent insulating substrate such as glass, light resistance, hardness and so on.

The inventors formed an anti-glare film using a sol-gel material such as a partially hydrolyzed condensate of an alkyl silicate, as previously proposed, as the binder material of the anti-glare film, and found that the obtained silicon oxide film had a large number of cracks, and was poor in hardness and durability. For this, it was supposed that cracks occurred due to stress on the interface between the transparent insulating substrate (glass plate) and the anti-glare film, which was caused by shrinkage of a material in the formation of silicon oxide by reactive curing, subsequent influences of heat and moisture, and so on.

Particles with the surface composed of pulverized surface, such as a glass frit, tend to be more randomly arranged in the anti-glare film as compared to spherical particles, so that the anti-glare film is easily formed with some of the fine particles exposed at the film surface. Thus, when an alkyl silicate or the like is used as a binder material of the anti-glare film, a failure such as peeling and falling of fine particles from the surface of the anti-glare film occurs if an external force such as a frictional force is applied to the anti-glare film. When the thickness of the anti-glare film is increased for firmly fixing fine particles in the anti-glare film, there is the problem in that surface irregularities associated with the fine particles are moderated, leading to the deterioration of the anti-glare property. Further, since the shape of the interface between the fine particles and the binder is indeterminate, cracks easily occur with the interface as an origination point.

On the other hand, silicon oxide containing an Si—O bond obtained by the hydrolysis of an Si—H bond and an Si—N bond is capable of forming an anti-glare film excellent in friction resistance and free from cracks because fine particles with the surface composed of pulverized surface, such as a glass frit, can be firmly fixed in the anti-glare film 10.

That is, in the present invention, the anti-glare film 10 is preferably a continuous film having no cracks. The phrase "having no cracks" means that, when five spots are randomly selected from an area of 10 cm$^2$ in the film surface of the anti-glare film, and SEM plane observation is performed at a magnification of 5000×, cracks are not found at any of the observed spots. It can be confirmed that an Si—O bond is obtained by the hydrolysis of an Si—H bond by finding that, immediately after the application of a binder material, an Si—H bond-derived peak of around 2160 cm$^{-1}$ exists in the infrared spectroscopic spectrum, and that the peak decreases and disappears with time, while Si—O bond-derived peaks of around 1060 cm$^{-1}$, 800 cm$^{-1}$ and 450 cm$^{-1}$ appear and grow. Similarly, it can be confirmed that an Si—O bond is obtained by the hydrolysis of an Si—N bond by finding that, immediately after the application of a binder material, an Si—N bond-derived peak around 840 cm$^{-1}$ exists in the infrared spectroscopic spectrum, and that the peak decreases and disappears with time, while Si—O bond-derived peaks of around 1060 cm$^{-1}$, 800 cm$^{-1}$ and 450 cm$^{-1}$ appear and grow. When the binder material is a hydrolyzed and cured product of a perhydropolysilazane (—[SiH$_2$—NH]$_n$—, an N—H bond-derived peak of around 3370 cm$^{-1}$ further decreases and disappears with time.

<Shape of Anti-Glare Film>

The thickness $d_1$ of the anti-glare film 10 is preferably 0.5 to 2 μm, more preferably 0.75 to 1.75 μm, and further preferably 1.0 to 1.5 μm. When the thickness $d_1$ is 0.5 μm or more, irregular-shaped particles having a primary average particle size of more than 0.1 μm can be firmly fixed to a surface of the substrate. When the thickness $d_1$ is 2 μm or less, surface irregularities conforming to the shape of the fine particles are easily formed on a surface of the anti-glare film 10, so that the anti-glare property of the film can be improved. When the anti-glare film 10 is formed by a coating method, the thickness $d_1$ can be calculated from a solid concentration of an anti-glare film formation coating solution, a coating amount and a coating area.

The maximum height $Ry_1$ of the surface of the anti-glare film 10 is preferably 1 to 10 μm, more preferably 3 to 8 μm, and further preferably 5 to 6 μm. When $Ry_1$ falls within the above-mentioned range, visible light (particularly light on the long wavelength side) in a wide-wavelength range is irregularly reflected by the anti-glare film 10, so that an anti-glare effect is easily obtained. When a roughness curve obtained using a laser microscope is cut by a reference (0.8 m) in the direction of an average line, the maximum height $Ry_1$ is a value represented by a distance between the top line and the bottom line in this cut portion.

Particularly, for obtaining a high anti-glare effect by irregularly reflecting light in a long wavelength range (e.g. infrared light having a wavelength of 900 nm or more), the arithmetic mean roughness Ra of the surface of the anti-glare film 10 is preferably 250 to 2000 nm, more preferably 300 to 1500 nm, more preferably 500 to 1250 nm, and further preferably 750 to 1000 nm. From a similar viewpoint, the roughness period Sm of the surface of the anti-glare film 10 is preferably 1 to 30 μm, more preferably 5 to 25 μm, and further preferably 10 to 20 μm. The roughness period Sm is an average value of the distances between the top-bottom cycles, which are each determined from an intersection point at which a roughness curve, obtained using a laser microscope, crosses an average line. The maximum height $Ry_1$, the arithmetic mean roughness $Ra_1$ and the roughness period $Sm_1$ are measured in accordance with JIS B0601-1994 for conditions other than those described herein.

The arithmetic mean roughness Ra and the roughness period Sm can be adjusted by changing, for example, the content of the fine particles with respect to the binder, or the particle size of the fine particles. The arithmetic mean roughness Ra tends to increase as the particle size of the fine particles increases, and the roughness period Sm tends to decrease as the content of the fine particles increases.

The ratio between the thickness $d_1$ and the maximum height $Ry_1$ ($Ry_1/d_1$) of the anti-glare film 10 is preferably 1 or more. $Ry_1/d_1$ being 1 or more indicates that the height difference of the surface irregularities is equal to or more than the average thickness of the anti-glare film, which means that the anti-glare film has sharply rugged surface irregularities in comparison with the thickness. In the present invention, a high irregular reflection effect is obtained because the anti-glare film 10 has sharply rugged surface irregularities. In the present invention, an anti-glare film having a large surface ruggedness, as described above, is obtained by using nonspherical fine particles with the surface composed of pulverized surface. An anti-glare film in the form of a continuous film, which has fine particles 12 firmly fixed therein and is free from cracks, although having a large surface ruggedness, is obtained by using the binder 11 having as a main component a silicon oxide containing an Si—O bond obtained by the hydrolysis of an Si—H bond and an Si—N bond. When $Ry_1/d_1$ is excessively large, the fixation of fine particles in the anti-glare film tends to be insufficient, leading to a reduction in strength. Thus, $Ry_1/d_1$ is preferably 1 to 20, more preferably 5 to 16, and further preferably 9 to 12.

<Method for Forming Anti-Glare Film>

The method for forming the anti-glare film 10 on the transparent insulating substrate 1 is not particularly limited, but a method is suitable in which a solution containing a silicon oxide binder or a precursor thereof and fine particles is applied onto the transparent insulating substrate 1. Examples of the coating method include a dipping method, a spin coating method, a bar coating method, a die coating method, a roll coating method (printing method), a flow coating method and a spraying method. Among these coating methods, the spraying method is preferred because special equipment is not required, and an anti-glare film can be easily formed on an insulating substrate even after a cell is sealed or after a module is installed on a roof, for example.

As a silicon oxide precursor contained in a coating solution for forming the anti-glare film 10, a polymer containing an Si—H bond and an Si—N bond is suitably used. The polymer containing an Si—H bond and an Si—N bond is preferably a polysilazane. The polysilazane is a polymer having an Si—N bond (silazane bond) as a basic unit, and is a material that reacts with moisture, for example, in the air, so that an Si—H bond and an Si—N bond are hydrolyzed to be converted into $SiO_2$. Examples of polysilazane may include perhydropolysilazanes which have no organic group in the molecule and include a repetition of a basic unit represented by —[SiH$_2$—NH]—, and organopolysilazanes in which hydrogen bonded to silicon and/or nitrogen is partially replaced by an organic group such as an alkyl group. Particularly, for increasing the content of an Si—H bond-derived Si—O bond to obtain an anti-glare film excellent in adhesion and strength, a perhydropolysilazane is suitably used. A mixture of a perhydropolysilazane and an organopolysilazane may be used.

As a coating solution to be used for forming an anti-glare film, one containing 0.01 to 20% by weight of inorganic fine particles, 0.1 to 20% by weight of a polysilazane, and a solvent is suitably used. As a solvent, one that dissolves a polysilazane and has an excellent dispersibility of inorganic fine particles is suitably used, and xylene, dibutyl ether or the like is especially preferably used.

The concentration of polysilazane in the anti-glare film formation coating solution is preferably 0.1% by weight to 20% by weight, more preferably 1% by weight to 10% by weight, and further preferably 2% by weight to 5% by weight. When the concentration of the polysilazane falls within the above-mentioned range, the coating solution has a solution viscosity suitable for coating by a spraying method or the like, and an anti-glare film having a thickness of 0.5 μm or more can be stably formed.

The concentration of inorganic fine particles in the anti-glare film formation coating solution is preferably 0.01% to 20% by weight, more preferably 0.1% to 10% by weight, and further preferably 1% to 5% by weight. When the concentration of fine particles in the coating solution falls within the above-mentioned range, fine particles are appropriately dispersed in the polysilazane, so that an anti-glare film excellent in anti-glare property is easily obtained.

As the inorganic fine particle in the anti-glare film, inorganic fine particles having pulverized surfaces are used, and a glass frit is suitably used as described above. Generally, a glass flit, for example, having a primary particle size of about 1 μm is aggregated in the air or in a solution to form secondary particles. The average secondary particle size of fine particles to be used in the coating solution is preferably 0.1 to 10 μm, more preferably 0.5 to 7.5 μm, and further preferably 1 to 5 μm. The average secondary particle size of the fine particles is measured by a dynamic light scattering method.

Polysilazane has an excellent embedment property in very small gaps, and therefore can penetrate into very small gaps between primary particles, even when fine particles are aggregated. Thus, according to the present invention, the anti-glare film 10 in the form of a continuous film, which is excellent in adhesion between the transparent insulating substrate 1 and the binder 11 and inorganic fine particles 12 and is free from cracks, can be formed, although indeterminate-shaped fine particles with the surface composed of pulverized surface are used.

The content of inorganic fine particles in the anti-glare film formation coating solution is preferably 10 to 200 parts by weight, more preferably 20 to 100 parts by weight, and further preferably 40 to 80 parts by weight based on 100 parts by weight of the binder. As the relative content of fine particles to the binder increases, the maximum height $Ry_1$ of the surface of the anti-glare film 10 after coating and the ratio between the thickness $d_1$ and the maximum height $Ry_1$ ($Ry_1/d_1$) tend to increase, leading to improvement in the light scattering property. On the other hand, when the relative content of fine particles is excessively large, the hardness of the inside of the anti-glare film may decrease, or the fixation of fine particles in the anti-glare film may be insufficient.

The coating solution to be used for forming an anti-glare film may contain components other than a binder, fine particles and a solvent. For example, a catalyst can be included in the coating solution for curing a polysilazane at normal temperatures to be converted into a silicon oxide.

Examples of the catalyst include N-heterocyclic compounds such as 1-methylpiperazine, 1-methylpiperidine, 4,4'-trimethylenedipiperidine, 4,4'-trimethylene-bis(1-methylpiperidine), diazabicyclo-[2,2,2]octane, cis-2,6-dimethylpiperazine, 4-(4-methylpiperidine)pyridine, pyridine, dipyridine, α-picoline, β-picoline, γ-picoline, piperidine, lutidine, pyrimidine, pyridazine, 4,4'-trimethylenedipyridine, 2-(methylamino)pyridine, pyrazine, quinoline, quinoxaline, triazine, pyrrole, 3-pyrroline, imidazole, triazole, tetrazole and 1-methylpyrrolidine; amines such as methylamine, dimethylamine, trimethylamine, ethylamine, diethylamine, triethylamine, propylamine, dipropylamine, tripropylamine, butylamine, dibutylamine, tributylamine, pentylamine, dipentylamine, tripentylamine, hexylamine, dihexylamine, trihexylamine, heptylamine, diheptylamine, octylamine, dioctylamine, trioctylamine, phenylamine, diphenylamine and triphenylamine; DBU (1,8-diazabicyclo[5,4,0]7-undecene), DBN (1,5-diazabicyclo[4,3,0]5-nonene), 1,5,9-triazacyclododecane and 1,4,7-triazacyclononane. Further, organic acids, inorganic acids, metal carboxylic acid salts, acetylacetonate complexes and so on are also mentioned as preferred catalysts. Examples of organic acids include acetic acid, propionic acid, butyric acid, valeric acid, maleic acid and stearic acid, and examples of the inorganic acid include hydrochloric acid, nitric acid, sulfuric acid, phosphoric acid, hydrogen peroxide, chloric acid and hypochlorous acid. The metal carboxylic acid salt is a compound represented by the formula: (RCOMM wherein R represents an aliphatic group or cycloaliphatic group with a carbon number of 1 to 22; M represents at least one metal selected from the group consisting of Ni, Ti, Pt, Rh, Co, Fe, Ru, Os, Pd, Ir and Al; and n represents a valence of M. The metal carboxylic acid salt may be an anhydride or a hydrate. The acetylacetonate complex is a complex in which an anion generated by acid dissociation from acetylacetone (2,4-pentadione) is coordinated with a metal atom. The acetylacetonate complex is generally represented by the formula $(CH_3COCHCOCH_3)nM$ wherein M represents a n-valent metal. Examples of a suitable metal M include nickel, platinum, palladium, aluminum and rhodium. In addition, organic metal compounds such as peroxides, metal chlorides, ferrocenes and zirconocenes can be used. The content of the catalyst in the coating solution is preferably about 0.5 to 10 parts by weight based on 100 parts by weight of the polysilazane.

A colored anti-glare film can also be formed by including a pigment or dye in the anti-glare film formation coating solution. Although the type of pigment or dye is not particularly limited, the pigment is preferably one that can be properly dispersed in a solvent in the coating solution, and the dye is preferably one that is dissolved in a solvent in the coating solution. For improving the color development, the particle size of the pigment is preferably small, and preferably about 50 to 200 nm. The content of the dye or pigment varies depending on a color to be developed, a type of the dye/pigment, and so on, but is preferably, for example, about 30 to 60 parts by weight based on 100 parts by weight of the solid of the anti-glare film.

Figure 3:
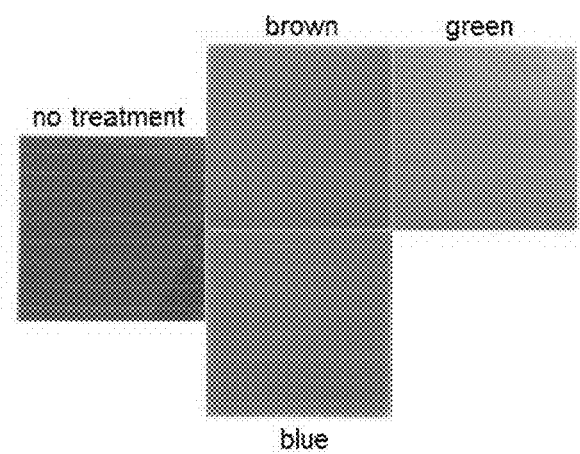
FIG. 3 is a photograph as a substitute for a drawing showing color solar cell modules.

By including a pigment or dye in the anti-glare film 10 to color the anti-glare film, a color solar cell module as shown in FIG. 3 can be prepared, so that the design property of the module can be improved, and design variations can be expanded. Since the anti-glare film 10 contains fine particles, color development of the pigment and dye tends to be improved. Thus, by including a pigment or dye in the anti-glare film to form a colored layer, a colored anti-glare film which is excellent in colorability and develops a clear color is obtained.

As a method for applying a coating solution to the transparent insulating substrate 1, an appropriate method such as a spraying method can be employed as described above. Curing of a polysilazane can proceed even under normal temperatures/normal pressures. Thus, it can be said that the spraying method is a coating method excellent in productivity because a coating solution can be stored in a tightly sealed state until just before use.

Figure 4:
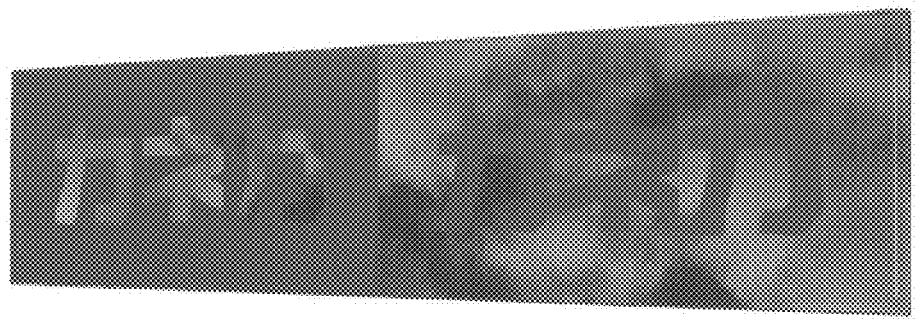
FIG. 4 is a photograph as a substitute for a drawing showing a solar cell module with a pattern anti-glare film

The anti-glare film 10 may be formed on the whole or only a part of a surface of the transparent insulating substrate 1. For example, an anti-glare region, on which an anti-glare film is formed, and a non-anti-glare region, on which an anti-glare film is not formed, can also be formed on the transparent insulating substrate 1. The anti-glare region and non-anti-glare region may be formed into a predetermined pattern to form a pattern anti-glare film. For example, a solar cell module with a pattern anti-glare film as shown in FIG. 4 may be formed by providing a mask material, such as a waterproof tape, on a part of a surface of the transparent insulating substrate 1 to cover a surface of a substrate before the formation of an anti-glare film, and selectively forming an anti-glare film on a region which is not provided with the mask. In the left half of the module shown in FIG. 4, an anti-glare film is formed after the character part is covered with a mask material, so that the character part is a non-anti-glare region. In the right half of the module shown in FIG. 4, an anti-glare film is formed after the non-character part is covered with a mask material, so that the character part is an anti-glare region. The shape of the anti-glare region or non-anti-glare region is not particularly limited, and may be a mark, a drawing pattern, a pattern or the like, as well as a character.

The wettability of the surface of the substrate can also be improved by subjecting the surface of the substrate to alkali washing or Cerico washing before applying a coating solution to the transparent insulating substrate 1. Since a polysilazane is excellent in adhesion (affinity) with glass and has a high embedment property in very small gaps as described above, a pretreatment for improving the wettability of the surface of the substrate can be omitted to enhance productivity in the present invention. After operations up to and including sealing of a cell are performed indoors, e.g. in a clean room in a factory, when the solar cell module, before an anti-glare film is formed on the surface of the substrate, is moved to the outdoors, e.g. a module installation site, followed by forming an anti-glare film, it is preferred that the pretreatment of the substrate can be omitted because the anti-glare film is easily formed.

After the coating solution is applied onto the transparent insulating substrate, a solvent in the coating solution is dried, and the polysilazane is cured to form an anti-glare film. When the anti-glare film 10 is formed after the solar cell 5 is formed on the transparent insulating substrate 1, it is preferred that the drying of a solvent in the coating solution and curing of the polysilazane are each performed at 80° C. or lower. When drying and curing are performed at such a low temperature, deterioration of power generation characteristics due to thermal degradation of an amorphous silicon semiconductor, for example, in the solar cell can be inhibited. Particularly, in the present invention, it is preferred that drying and curing are performed under normal temperatures/normal pressures. Particularly, when an anti-glare film is formed outside a factory, e.g. at a module installation site, it is preferred that drying and curing are performed under normal temperatures/normal pressures for easily forming an anti-glare film. Normal temperatures/normal pressures refer to an environment where artificial heating and compression/decompression from the outside are not performed, like a usual outdoor environment.

An anti-glare film obtained in this manner is excellent in adhesion with the transparent insulating substrate 1, and hard to be cracked, and has a high anti-glare property. The pencil hardness of the anti-glare film 10 by the pencil hardness test (JIS K5600) is preferably 3H or more, more preferably 5H or more, and further preferably 6H or more.

[Second Inorganic Layer]

Figure 2:
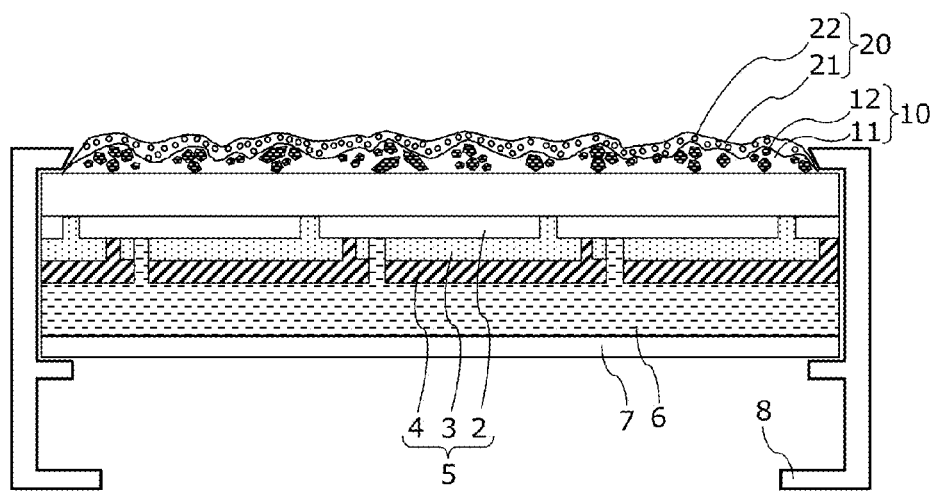
FIG. 2 is a schematic cross sectional view of a solar cell module according to one embodiment.

The solar cell module of the present invention may further include other layers on the anti-glare film 10. FIG. 2 illustrates a solar cell module including a second inorganic layer 20 on the anti-glare film 10. The second inorganic layer 20 can function as an anti-reflection layer, an anti-fouling layer or the like. For example, by providing on the anti-glare film 10 the second inorganic layer 20 having an average thickness $d_2$ of 50 nm to 1000 nm and a refractive index smaller than that of the anti-glare film, reflection of incident light at the interface can be reduced to improve conversion characteristics while the anti-glare property from the anti-glare film 10 is maintained.

The second inorganic layer 20 contains a binder 21. The binder 21 that forms the second inorganic layer 20 is preferably made of a material excellent in adhesion with the anti-glare film 10, and an inorganic binder is suitably used. The inorganic binder 21 is not particularly limited as long as it has transparency, but a silicon-based compound is preferred, and particularly a silicon oxide is preferred. When the binder 11 of the anti-glare film and the binder 21 of the second inorganic layer are made of the same type of materials, a high-mechanical-strength film, which is excellent in adhesion at the interface and can contribute to the prevention of the detachment of fine particles 12 in the anti-glare film 10 from the film surface, is easily obtained.

Preferably, the second inorganic layer 20 is curable at a low temperature, more preferably at normal temperature/normal pressure, like the anti-glare film 10. Thus, as the binder 21 in the second inorganic layer, a silicon oxide with a polysilazane as a precursor (i.e. a silicon oxide containing an Si—O bond formed by hydrolysis of an Si—H bond and an Si—N bond) is especially preferably used.

The average thickness $d_2$ of the second inorganic layer 20 is preferably 50 to 1000 nm, more preferably 75 to 750 nm, and further preferably 100 to 500 nm. The ratio between the average thickness $d_1$ of the anti-glare film 10 and the average thickness $d_2$ of the second inorganic layer 20 ($d_2/d_1$) is preferably 0.025 to 0.5, more preferably 0.04 to 0.4, and further preferably 0.06 to 0.3.

When the thickness $d_2$ falls within the above-mentioned range, the surface of the second inorganic layer 20, i.e. a surface of the solar cell module on the light receiving surface side can retain the irregular pattern of the anti-glare film 10, so that the anti-glare property from the irregular shape of the anti-glare film can be maintained. From a similar viewpoint, the ratio of the thickness $d_2$ of the second inorganic layer 20 to the average primary particle size of the fine particles 12 in the anti-glare film 10 is preferably 0.025 to 0.8, more preferably 0.04 to 0.7, and further preferably 0.06 to 0.6. When the second inorganic layer 20 is formed by a coating method, the thickness $d_2$ can be calculated from a solid concentration of a coating solution, a coating amount and a coating area.

The average refractive index $n_2$ of the second inorganic layer 20 is preferably smaller than the average refractive index $n_1$ of the anti-glare film 10. The difference between $n_1$ and $n_2$ is preferably 0.03 or more, more preferably 0.05 or more, further preferably 0.07 or more, and especially preferably 0.10 or more. While the average refractive index $n_1$ of the anti-glare film 10 mainly composed of silicon oxide is about 1.45 to 1.55, the average refractive index $n_2$ of the second inorganic layer 20 is preferably 1.45 or less, and further preferably 1.40 or less.

When $n_1 > n_2$, the refractive index gradually increases along the light incident direction in the air (refractive index=1) at the interface on the light receiving surface side to the second inorganic layer 20 to the anti-glare film 10 to the transparent insulating substrate 1. Thus, reflection at the interface is reduced to increase the amount of light captured in the solar cell module, so that conversion characteristics (particularly short circuit current density) of the solar cell module can be improved.

An example of the method for reducing the refractive index $n_2$ of the second inorganic layer 20 is using a low-refractive-index material as the binder 21. On the other hand, for improving adhesion between the anti-glare film 10 and the second inorganic layer 20, the binders 11 and 21 contained in the former and the latter, respectively, have preferably the same kind or similar kinds of components as described above. Thus, it is preferred that the refractive index of the second inorganic layer is reduced by including in the second inorganic layer 20 inorganic fine particles 22 having a refractive index lower than that of the binder 21 as shown in FIG. 2. The difference between the refractive index of the binder 21 and the refractive index of the fine particle 22 is preferably 0.05 or more, more preferably 0.10 or more, and further preferably 0.13 or more.

When the second inorganic layer 20 contains the inorganic fine particles 22, the average primary particle size calculated from observation of a cross section is preferably 10 nm to 300 nm, more preferably 20 nm to 150 nm, and further preferably 30 nm to 100 nm. For moderating the irregular shape of the surface of the anti-glare film 10, the average primary particle size of the inorganic fine particles 22 in the second inorganic layer 20 is preferably smaller than the average primary particle size of the inorganic fine particles 12 in the anti-glare film 10.

When the particle size of the fine particles 22 in the second inorganic layer 20 is 300 nm or less, refraction/reflection/scattering of light at the interface between the binder 21 and the fine particle 22 is suppressed because the particle size is smaller as compared to the main wavelength range of sunlight. Thus, the refractive index of the second inorganic layer 20 is reduced, and a loss of light resulting from reflection/scattering of light incident to inside of the anti-glare film 10 is reduced. When the particle size of the fine particles 22 is 10 nm or more, the fine particles 22 can be properly dispersed in the film.

The material of the fine particles 22 in the second inorganic layer 20 is not particularly limited as long as the refractive index thereof is lower than that of the binder 21. For example, a metal fluoride such as magnesium fluoride can be used as a material having a low refractive index. As low-refractive-index particles, hollow particles can be used. Hollow particles have a refractive index that lies in between the refractive indexes of their constituent material and air, and are therefore suitable for reducing the refractive index. As hollow particles, hollow silica particles are preferred from the viewpoint of dispersibility in the film and mechanical strength, and particularly hollow colloidal silica particles are suitably used.

When the second inorganic layer 20 contains the fine particles 22, the content thereof is not particularly limited, but is preferably 10 parts by weight or more, more preferably 30 parts by weight or more, and further preferably 40 parts by weight or more based on 100 parts by weight of the binder for achieving a reduction of the refractive index. The upper limit of the content of the fine particles 22 is not particularly limited, but when the relative content of the fine particles 22 is excessively high, the hardness of the second inorganic layer may decrease, or fixation of fine particles may be insufficient. Thus, the content of the fine particles 22 is preferably 300 parts by weight or less, more preferably 200 parts by weight or less, and further preferably 150 parts by weight or less based on 100 parts by weight of the binder.

The method for forming the second inorganic layer 20 on the anti-glare film 10 is not particularly limited. For example, similarly to the formation of the anti-glare film 10, a coating solution containing a binder and fine particles as necessary can be applied by a coating method such as a spraying method, and dried and cured to form a second inorganic layer.

EXAMPLES

The present invention will be described in more detail below by showing the Examples and Comparative Examples. The scope of the present invention is not limited to the Examples below as long as it does not depart from the scope of the present invention. In the Examples and Comparative Examples below, an evaluation was performed with an anti-glare film formed on a glass plate which was not provided with a solar cell, so that the difference in the properties of the anti-glare film could be made clearer, but it is easily understood that similar results are obtained even if a solar cell is formed on a glass plate.

The wear resistance of the anti-glare film was evaluated by the pencil hardness test (JIS K5600). For the anti-glare property, reflected light from a white fluorescent lamp, which was applied to a glass substrate provided with an anti-glare film, was visually observed, and an evaluation was performed in five grades from the "image of a fluorescent lamp looking blurred" (grade A) to the "image of a fluorescent lamp that looks straight" (grade E: equivalent to that of a glass substrate which is not provided with an anti-glare film).

Example 1

(Preparation of Coating Solution)

As an anti-glare film formation coating solution, 1.5 parts by weight of a pulverized glass powder (manufactured by Nippon Frit Co., Ltd.; average secondary particle size: 1.0 μm) was added to 12.5 parts by weight of a polysilazane-containing solution (trade name: "AQUAMICA NAX120-20" manufactured by AZ Electronic Materials Corporation, which contains a perhydropolysilazane having a solid concentration of 20% by weight) in dibutyl ether, and 86.0 parts by weight of dibutyl ether was further added as a solvent to prepare a coating solution. The coating solution contained 60 parts by weight of fine particles based on 100 parts by weight of a polysilazane, and had a total solid concentration of 4% by weight.

(Formation of Anti-Glare Film)

A transparent glass substrate for a solar cell, which had a thickness of 3.2 mm and a size of 1400 mm×1100 mm, was washed with tap water, freed of water droplets by an air knife, and dried. The coating solution was applied to one of the surfaces of the dried glass substrate by a spraying method so as to achieve a thickness of 1.0 μm after drying, and the coated film was dried at room temperature, and then left standing at room temperature for 24 hours to cure a binder, thereby forming an anti-glare film having a silicon oxide as a main component. When an infrared spectrum of a binder portion (portion excluding fine particles) of the anti-glare film, after being left standing for 24 hours, was measured by infrared microspectrometry, peaks around 2160 cm$^{-1}$ (Si—H bond), around 840 cm$^{-1}$ (Si—N bond) and around 3370 cm$^{-1}$ (N—H bond) were observed in addition to Si—O bond-derived peaks around 1060 cm$^{-1}$, around 800 cm$^{-1}$ and around 450 cm$^{-1}$.

When an infrared spectrum was measured again after the glass substrate provided with an anti-glare film was left standing in an outdoor environment for 2 months, peaks around 2160 cm$^{-1}$, around 840 cm$^{-1}$ and around 3370 cm$^{-1}$ disappeared, so that it was confirmed that an Si—O bond was generated by hydrolysis of an Si—H bond and an Si—N bond.

Example 2

A coating solution was prepared in the same manner as in Example 1, and the glass substrate was immersed in the coating solution, and drawn up at a speed of 500 mm/minute to apply the coating solution to the substrate by a dipping method. Thereafter, the coated film was dried and cured at room temperature in the same manner as in Example 1.

Example 3

A coating solution was prepared and an anti-glare film was formed in the same manner as in Example 1, except that a pulverized glass powder having an average secondary particle size of 2.9 μm was used in the preparation of the coating solution.

Comparative Example 1

(Preparation of Coating Solution)

As an anti-glare film formation coating solution, 33.0 g of an oligomer of tetraethyl orthosilicate (TEOS) (polymerization degree n: 4 to 6) as a binder and 27.0 g of a pulverized glass powder (manufactured by Nippon Frit Co., Ltd.; average secondary particle size: 1.0 μm) as fine particles were sequentially added to a mixed liquid of 40.5 g of water, 281.9 g of isopropyl alcohol and 35.4 g of 1.63% hydrochloric acid, and the mixture was stirred and mixed at room temperature for 4 hours. Thereafter, 482.1 g of isopropanol was added as a diluent solvent, and the mixture was stirred to prepare a coating solution containing 82 parts by weight of fine particles based on 100 parts by weight of tetraethoxysilane and having a total solid concentration of 6.7% by weight.

(Formation of Anti-Glare Film)

The coating solution was applied to one of the surfaces of a glass substrate similar to that used in Example 1 by a spraying method so as to achieve a thickness of 2.5 μm after drying, and the coated film was cured by performing a firing treatment at 200° C. for 60 minutes, thereby forming an anti-glare film having silicon oxide as a main component. When an infrared spectrum of a binder portion (portion excluding fine particles) of the anti-glare film was measured by infrared microspectrometry, a peak was not observed around 2160 cm$^{-1}$.

Comparative Example 2

A coating solution similar to that in Comparative Example 1 was prepared, and the glass substrate was immersed in the coating solution, and drawn up at a speed of 500 mm/minute to apply the coating solution to the substrate by a dipping method. Thereafter, the coated film was dried and cured by heating in the same manner as in Comparative Example 1.

Comparative Example 3

(Preparation of Coating Solution)

As an anti-glare film formation coating solution, 80 parts by weight of an acryl-based UV-cured resin (trade name: "FX-V5400" manufactured by ADEKA CORPORATION), 15 parts by weight of dibutyl ether and 5 parts by weight of a pulverized glass powder (manufactured by Nippon Frit Co., Ltd.; average secondary particle size: 1.0 μm) were mixed and stirred to prepare a coating solution containing 78 parts by weight of fine particles based on 100 parts by weight of the resin and having a total solid concentration of 45.6% by weight.

(Formation of Anti-Glare Film)

The coating solution was applied to one of the surfaces of a glass substrate similar to that used in Example 1 by a bar coating method so as to achieve a thickness of 5 μm after drying, a hot air drying treatment was performed at 80° C. for 30 minutes, and an ultraviolet ray (wavelength: 365 nm) of 5000 mJ was applied to cure the coated film, thereby forming an anti-glare film.

Comparative Example 4

A coating solution was prepared and an anti-glare film was formed in the same manner as in Example 1, except that as inorganic fine particles, spherical glass beads (manufacture by Potters-Ballotini Co., Ltd.; average secondary particle size: 5.0 μm) were used in place of a pulverized glass powder.

Evaluation

Figure 5:
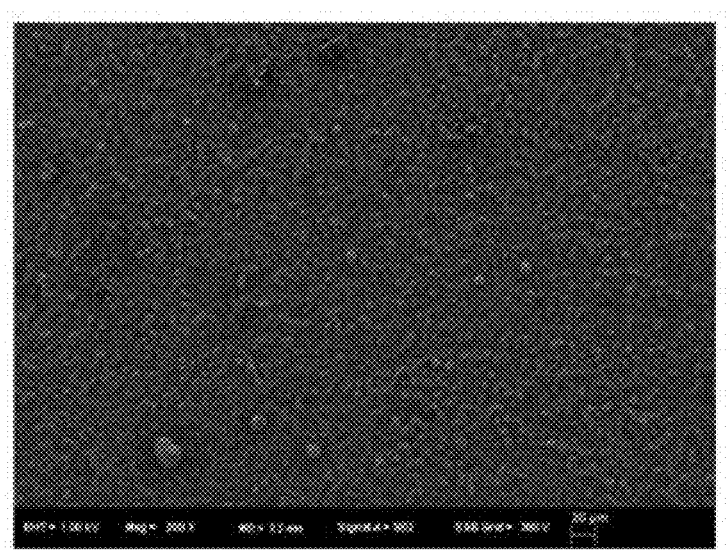
FIG. 5 is a SEM plane observation image (magnification: 200×) of an anti-glare film of an Example.
Figure 6:
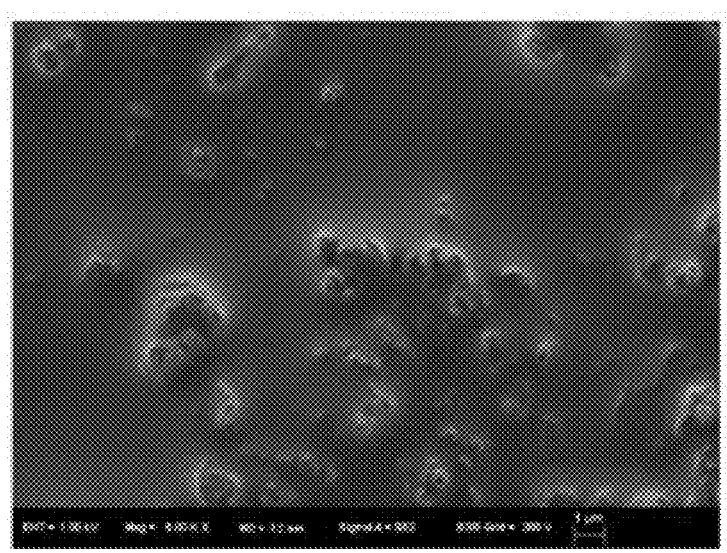
FIG. 6 is a SEM plane observation image (magnification: 5000×) of an anti-glare film of an Example.
Figure 7:
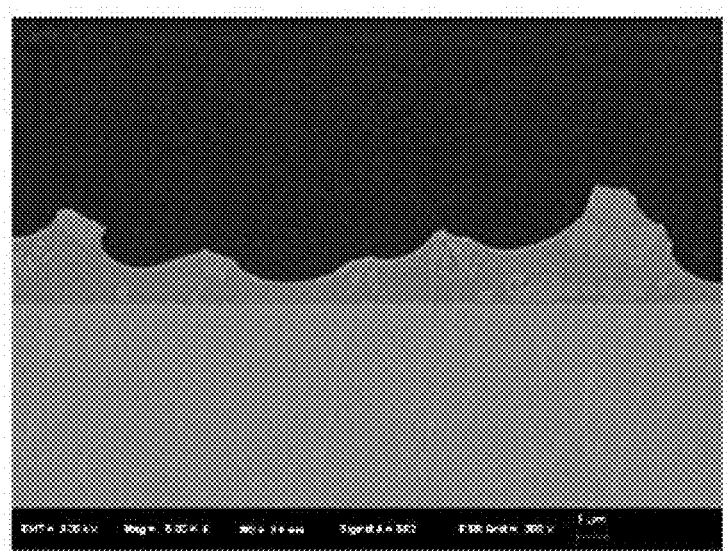
FIG. 7 is a SEM plane observation image (magnification: 5000×) of an anti-glare film of an Example.
Figure 8:
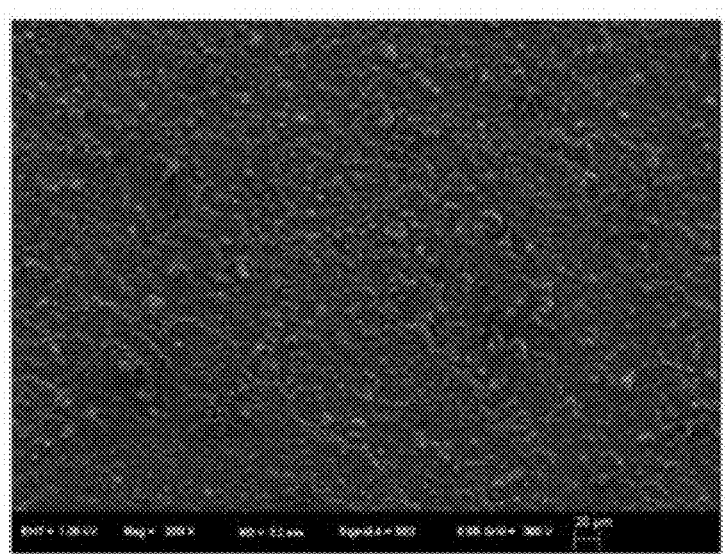
FIG. 8 is a SEM plane observation image (magnification: 200×) of an anti-glare film of an Example.
Figure 9:
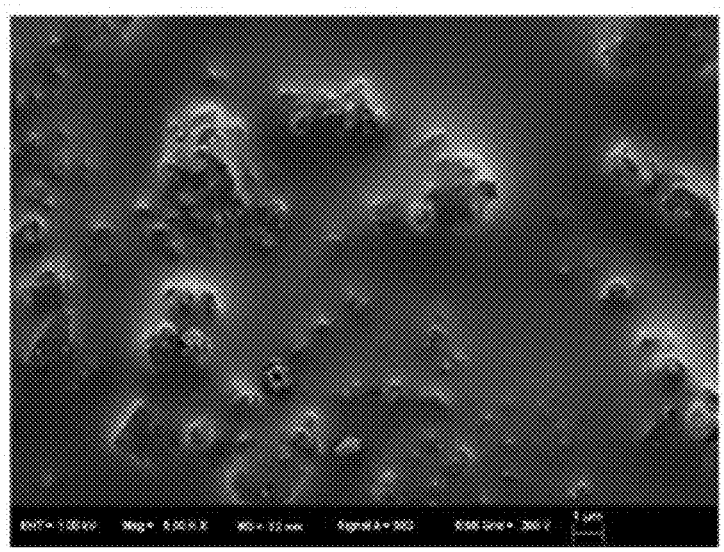
FIG. 9 is a SEM plane observation image (magnification: 5000×) of an anti-glare film of an Example.
Figure 10:
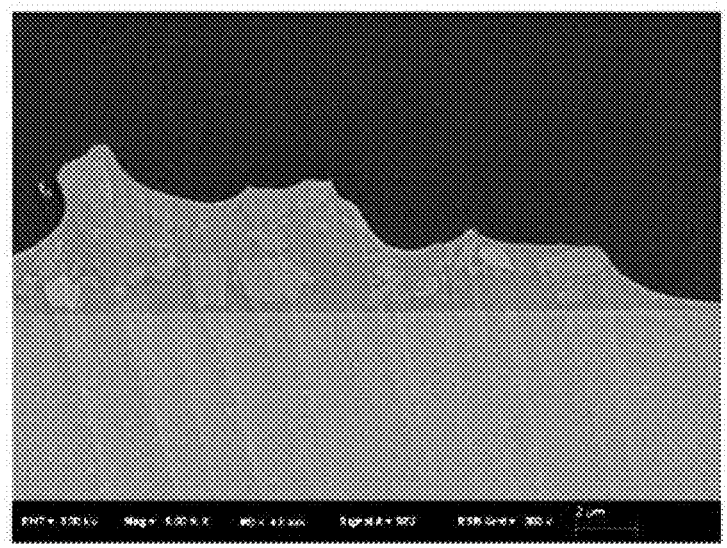
FIG. 10 is a SEM plane observation image (magnification: 5000×) of an anti-glare film of an Example.
Figure 11:
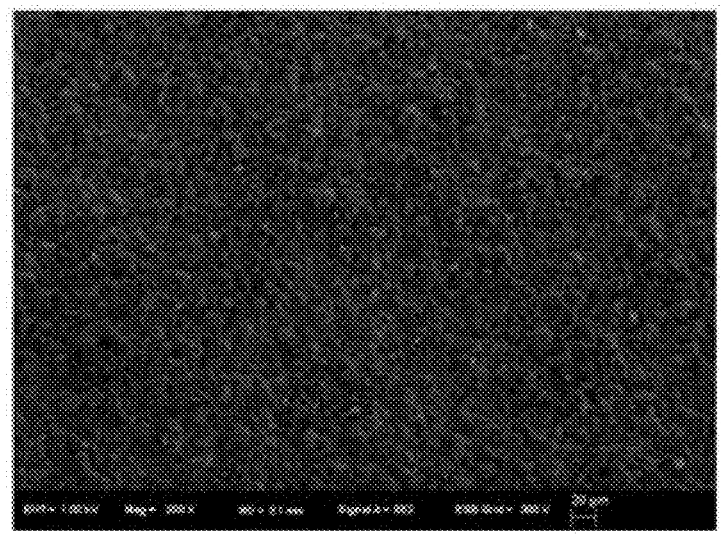
FIG. 11 is a SEM plane observation image (magnification: 200×) of an anti-glare film of an Example.
Figure 12:
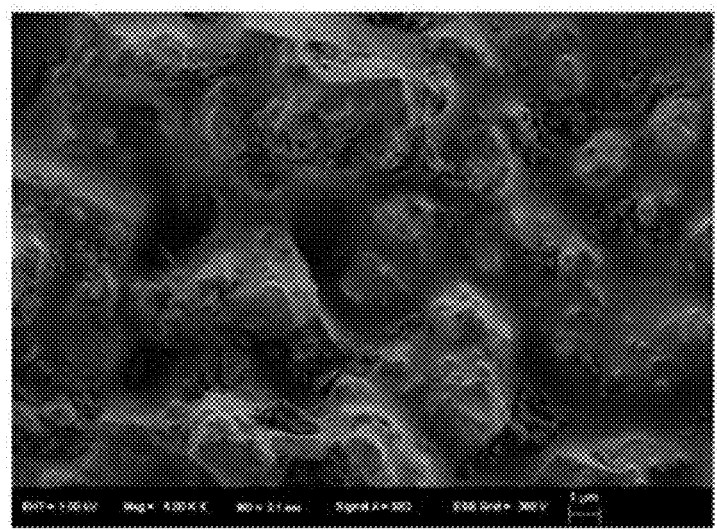
FIG. 12 is a SEM plane observation image (magnification: 5000×) of an anti-glare film of an Example.
Figure 13:
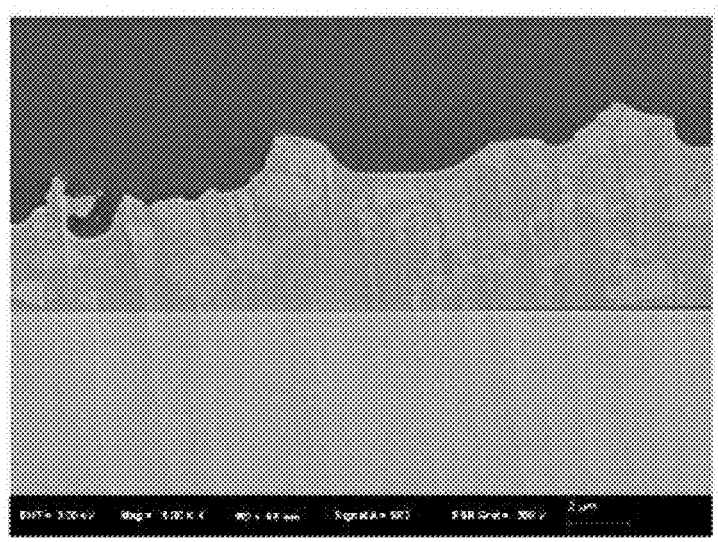
FIG. 13 is a SEM plane observation image (magnification: 5000×) of an anti-glare film of an Example.
Figure 14:
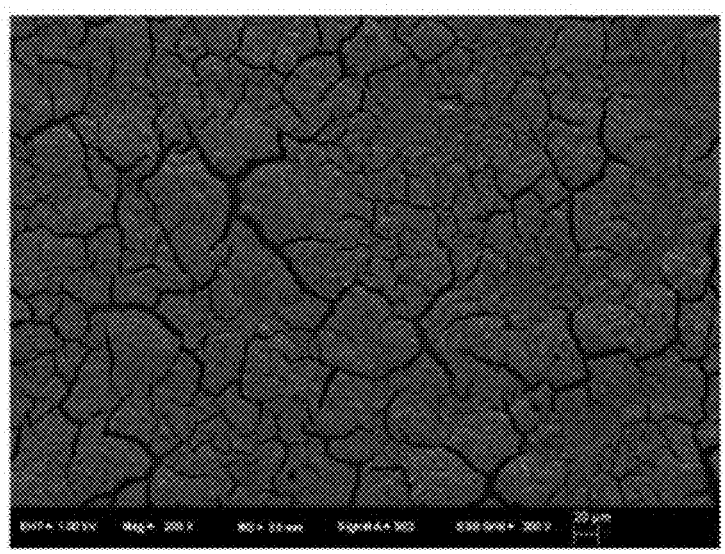
FIG. 14 is a SEM plane observation image (magnification: 200×) of an anti-glare film of a Comparative Example.
Figure 15:
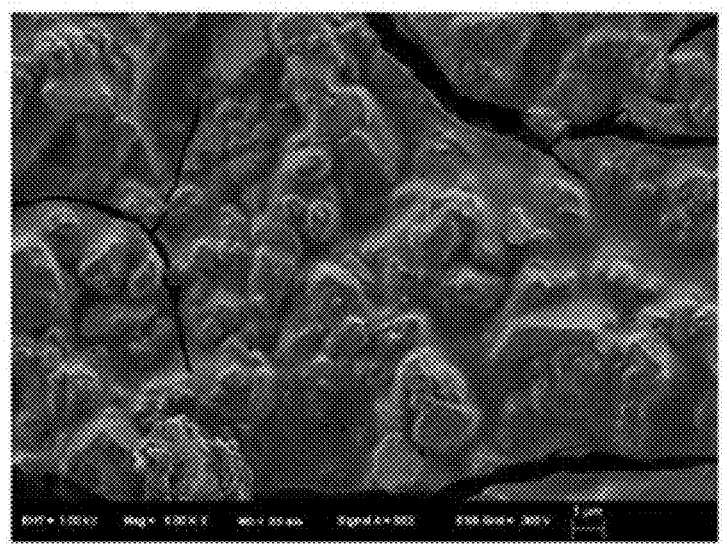
FIG. 15 is a SEM plane observation image (magnification: 5000×) of an anti-glare film of an Example.
Figure 17:
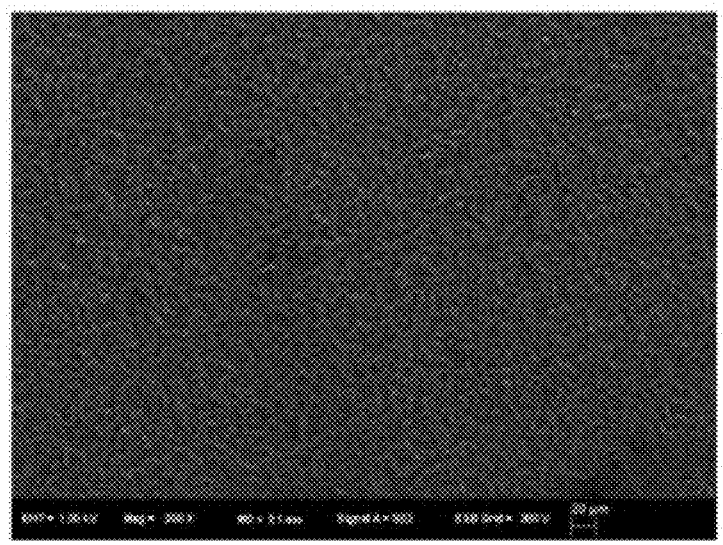
FIG. 17 is a SEM plane observation image (magnification: 200×) of an anti-glare film of a Comparative Example.
Figure 18:
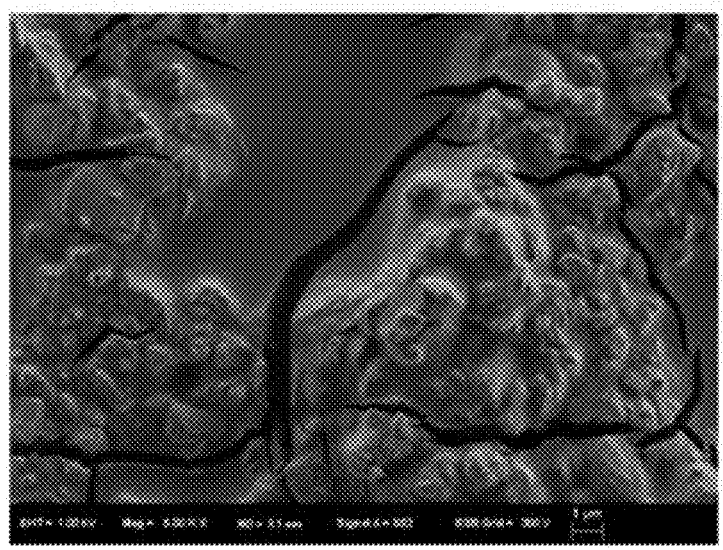
FIG. 18 is a SEM plane observation image (magnification: 5000×) of an anti-glare film of a Comparative Example.
Figure 19:
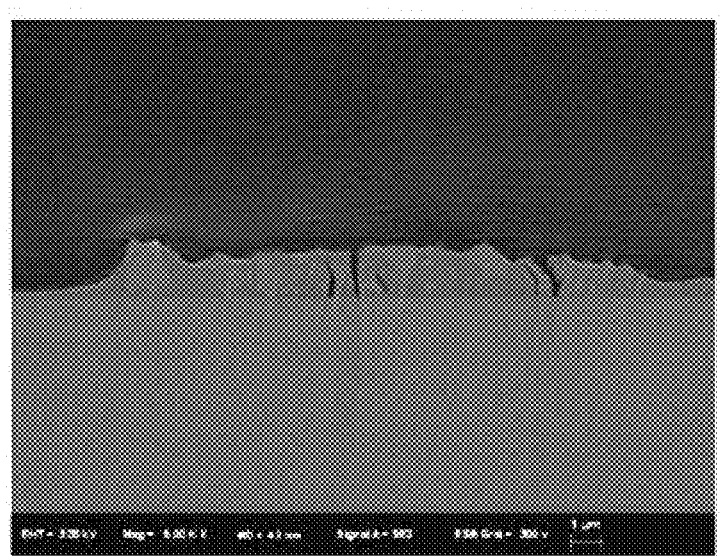
FIG. 19 is a SEM plane observation image (magnification: 5000×) of an anti-glare film of a Comparative Example.
Figure 20:
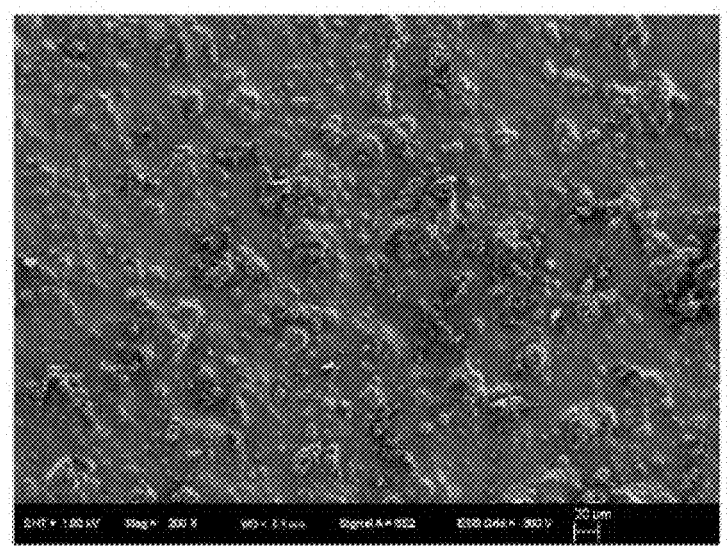
FIG. 20 is a SEM plane observation image (magnification: 200×) of an anti-glare film of a Comparative Example.
Figure 21:
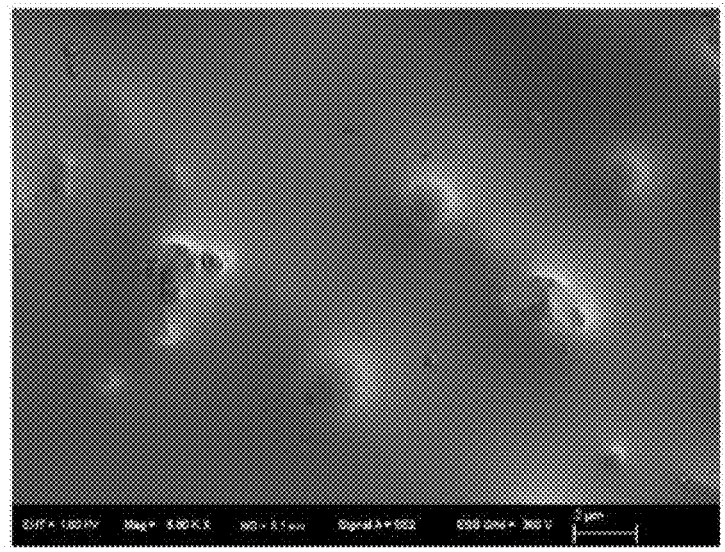
FIG. 21 is a SEM plane observation image (magnification: 5000×) of an anti-glare film of a Comparative Example.
Figure 22:
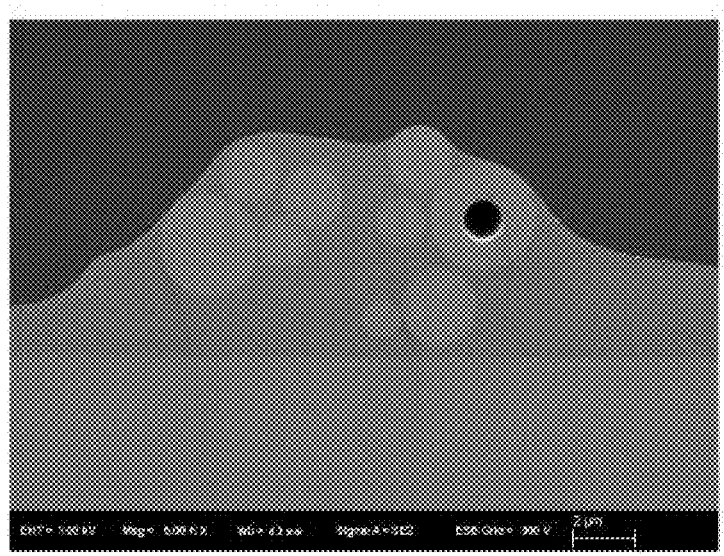
FIG. 22 is a SEM plane observation image (magnification: 5000×) of an anti-glare film of a Comparative Example.

The results of evaluating the anti-glare films obtained in the Examples and Comparative Examples described above are shown in Table 1 together with compositions and coating methods for the coating solutions used. SEM surface observation images and cross-section observation images of the anti-glare film in Example 1 are shown in FIGS. 5 to 7, SEM surface observation images and cross-section observation images of the anti-glare film in Example 2 are shown in FIGS. 8 to 10, SEM surface observation images and cross-section observation images of the anti-glare film in Example 3 are shown in FIGS. 11 to 13, SEM surface observation images and cross-section observation images of the anti-glare film in Comparative Example 1 are shown in FIGS. 14 to 16, SEM surface observation images and cross-section observation images of the anti-glare film in Comparative Example 2 are shown in FIGS. 17 to 19, and SEM surface observation images and cross-section observation images of the anti-glare film in Comparative Example 4 are shown in FIGS. 20 to 22.

TABLE 1

| | Coating solution | | | | | Anti-glare film | | | | | | | | |
|---|---|---|---|---|---|---|---|---|---|---|---|---|---|---|
| | fine particle | | | Coating method | | | | | | | | | | |
| | | | secondary particle diameter (μm) | coating method | cure temperature (° C.) | thickness $d_1$ (μm) | $Ry_1$ (μm) | $Ry_1/d_1$ | $Ra_1$ (μm) | $Sm_1$ (μm) | primary particle diameter (μm) | crack | anti-glare property | pencil hardness |
| | binder material | material | | | | | | | | | | | | |
| Example 1 | polysilazane | pulverized glass | 1.0 | spray | room temperature | 1.0 | 2.9 | 2.9 | 0.5 | 14.5 | 0.8 | absent | B | >6 H |
| Example 2 | polysilazane | pulverized glass | 1.0 | dip | room temperature | 1.2 | 3.5 | 2.9 | 0.5 | 17.1 | 0.8 | absent | B | >6 H |
| Example 3 | polysilazane | pulverized glass | 2.9 | spray | room temperature | 1.8 | 4.3 | 2.4 | 0.8 | 16.6 | 1.8 | absent | A | >6 H |
| Comparative Example 1 | TEOS | pulverized glass | 1.0 | spray | 200 | 2.5 | 2.2 | 0.9 | 0.5 | 18.1 | 0.8 | present | B | 2 H |
| Comparative Example 2 | TEOS | pulverized glass | 1.0 | dip | 200 | 2.3 | 2.1 | 0.9 | 0.4 | 15.9 | 0.8 | present | B | 2 H |
| Comparative Example 3 | UV cure resin | pulverized glass | 1.0 | bar coat | — (UV) | 5.0 | 4.0 | 0.8 | 0.5 | 16.4 | — | — | B | HB |
| Comparative Example 4 | polysilazane | glass beads | 5.0 | Spray | room temperature | 2.3 | 4.3 | 1.9 | 0.9 | 17.5 | 2.5 | absent | C | >6 H |

Figure 16:
FIG. 16 is a SEM plane observation image (magnification: 5000×) of an anti-glare film of a Comparative Example.

In Comparative Example 1 where as a binder, a coating solution containing tetraethyl orthosilicate as a sol-gel material was applied by spraying to form an anti-glare film, cracks with an origination point on or near the surfaces of the fine particles were generated, and film peeling was observed in a cross-sectional observation (FIG. 16). On the other hand, in Comparative Example 2 where an anti-glare film was formed by a dipping method, generation of cracks was suppressed in comparison to Comparative Example 1, but cracks with an origination point on or near the surfaces of fine particles were observed in a SEM plane observation (FIG. 18) and cross-sectional observation (FIG. 19) at a magnification of 5000×.

In Comparison Example 3 where an UV-cured resin was used as a binder, cracks as in Comparative Examples 1 and 2 were not observed, but the pencil hardness was in the order of HB, and thus the strength was insufficient as an anti-glare film of a solar cell module that would be exposed in an outdoor environment for a long period of time.

In Comparative Example 4, since a polysilazane material was used as a binder to form an anti-glare film having an Si—O bond obtained by hydrolysis of an Si—H bond and an Si—N bond, the anti-glare film were free from cracks, and had a sufficient hardness with the pencil hardness being 6H or more. However, the anti-glare film in Comparative Example 4 did not have a sufficient anti-glare property. This may be because, as shown in the SEM cross-section picture of FIG. 22, projection portions associated with fine particles include curved surfaces, so that light is hardly reflected irregularly.

On the other hand, it is apparent that in Examples 1 to 3, where a polysilazane material was used as a binder, and a pulverized glass powder was used as fine particles, an anti-glare film having both a high anti-glare property and a high film strength was formed, even though the average particle size of the fine particles and the method for applying a coating solution onto a glass substrate were changed.

Among Examples 1 to 3, particularly Example 3 where the arithmetic mean roughness of the anti-glare film was increased to 0.8 μm by increasing the particle size of fine particles, showed a high anti-glare property. On the other hand, Comparative Example 4, where glass beads were used as fine particles, had a poor anti-glare property although it had a larger $Ra_1$ in comparison to Examples 1 to 3. This may be because in Examples 1 to 3, nonspherical particles with the surface composed of pulverized surface were used as inorganic fine particles, whereby light was irregularly reflected, so that a higher anti-glare property was exhibited in comparison to Comparative Example 4, where spherical fine particles were used. Thus, it is apparent that in Examples 1 to 3, fine particles are firmly fixed by a binder, so that an anti-glare film, which has an irregularly shaped surface suitable for irregular reflection and is excellent in strength, even when the thickness $d_1$ is small, is formed.

DESCRIPTION OF REFERENCE CHARACTERS 10 anti-glare film
20 inorganic layer
11 binder
12 fine particle
1 transparent insulating substrate
2, 4 electrode layer
3 photoelectric conversion layer
5 solar cell
6
7 back
8 frame

The invention claimed is:
1. A solar cell module comprising:
at least one solar cell on a first principal surface of a transparent insulating substrate; and an anti-glare film on a second principal surface of the transparent insulating substrate, wherein
the anti-glare film is a continuous film having no cracks and contains transparent inorganic fine particles in an inorganic binder,
the anti-glare film has an average thickness $d_1$ of 500 nm to 2000 nm and a surface maximum height $Ry_1$ of 1000 nm to 10000 nm,
the inorganic binder includes cured polysilazane as a main component, and
the inorganic fine particles are frits having an average primary particle size of 0.1 μm to 5.0 μm as calculated from observation of a cross section of the anti-glare film.

2. The solar cell module according to claim 1, wherein the anti-glare film has a surface arithmetic average roughness $Ra_1$ of 250 nm to 2000 nm and a roughness period $Sm_1$ of 1 µm to 30 µm.

3. The solar cell module according to claim 1, wherein the anti-glare film has a ratio $Ry_1/d_1$ of 1 to 20 where $d_1$ is a thickness and $Ry_1$ is a maximum height.

4. The solar cell module according to claim 1, wherein the inorganic fine particle includes $SiO_2$ as a main component.

5. The solar cell module according to claim 1, the solar cell module further comprising a second inorganic layer on a surface of the anti-glare film on a side opposite to the transparent insulating substrate, wherein
the second inorganic layer has an average thickness $d_2$ of 50 nm to 1000 nm, and has a refractive index smaller than that of the anti-glare film.

6. The solar cell module according to claim 1, wherein the at least one solar cell comprises a first electrode layer, a photoelectric conversion unit and a second electrode layer from the transparent insulating substrate side, the layers are each provided with linear separation grooves and thereby divided into a plurality of cells, and the plurality of cells are electrically connected to one another in series or in parallel.

7. The solar cell module according to claim 1, wherein the at least one solar cell is a crystalline silicon-based solar cell comprising a crystalline silicon substrate.

8. The solar cell module according to claim 1, wherein the solar cell module has on the second principal surface of the transparent insulating substrate an anti-glare region on which the anti-glare film is formed and a non-anti-glare region on which the anti-glare film is not formed, the anti-glare film being a continuous film within a region it occupies, having no cracks.

9. The solar cell module according to claim 1, wherein the anti-glare film further contains a pigment or a dye.

10. A method for manufacturing a solar cell module having at least one solar cell on a first principal surface of a transparent insulating substrate and an anti-glare film on a second principal surface of the transparent insulating substrate, the method comprising:
a cell forming step of forming the solar cell on the first principal surface of the transparent insulating substrate;
an anti-glare film forming step of forming the anti-glare film containing transparent inorganic fine particles in an inorganic binder including cured polysilazane as a main component of the inorganic binder, and having an average thickness $d_1$ of 500 nm to 2000 nm, by applying an anti-glare film formation coating solution to the second principal surface of the transparent insulating substrate, in this order, wherein
the anti-glare film formation coating solution contains inorganic fine particles, an inorganic binder precursor and a solvent,
the inorganic binder precursor includes polysilazane as a main component of the inorganic binder precursor by hydrolysis of an Si H bond and an Si N bond, and
the inorganic fine particles are frits having an average primary particle size of 0.1 µm to 5.0 µm as calculated from observation of a cross section of the anti-glare film,
thereby the anti-glare film has a surface maximum height $Ry_1$ of 1000 nm to 10000 nm.

11. The method for manufacturing the solar cell module according to claim 10, wherein the at least one solar cell comprises a first electrode layer, a photoelectric conversion unit and a second electrode layer from the transparent insulating substrate side, the layers are each provided with linear separation grooves and thereby divided into a plurality of cells, and the plurality of cells are electrically connected to one another in series or in parallel, wherein
in the cell forming step, the separation grooves are formed by applying laser light from the second principal surface side of the transparent insulating substrate.

12. The method for manufacturing the solar cell module according to claim 10, wherein
the anti-glare film formation coating solution contains 0.01 to 20% by weight of inorganic fine particles, 0.1 to 20% by weight of a polysilazane and a solvent in the anti-glare film formation step,
the solvent in the anti-glare film formation coating solution is dried and the polysilazane is cured, after the anti-glare film formation coating solution is applied.

13. The method for manufacturing the solar cell module according to claim 12, wherein the inorganic fine particles have an average secondary particle size of 0.1 µm to 10 µm.

14. The method for manufacturing the solar cell module according to claim 10, wherein the cell forming step is carried out indoors, and thereafter the transparent insulating substrate provided with the solar cell is taken outdoors, the anti-glare film forming step is carried out outdoors, wherein the anti-glare film formation coating solution is applied by a spraying method.

* * * * *

UNITED STATES PATENT AND TRADEMARK OFFICE
CERTIFICATE OF CORRECTION

PATENT NO. : 9,929,286 B2
APPLICATION NO. : 14/430525
DATED : March 27, 2018
INVENTOR(S) : Naoto Iitsuka, Kazuhiro Shimizu and Takeyoshi Takahashi It is certified that error appears in the above-identified patent and that said Letters Patent is hereby corrected as shown below:

In the Claims

In Column 22 Line 8, delete "by"

In Column 22 Line 9, delete "hydrolysis of an Si H bond and an Si N bond"

Signed and Sealed this
Twenty-second Day of May, 2018

Andrei Iancu
*Director of the United States Patent and Trademark Office*